(12) United States Patent
Gutermuth

(10) Patent No.: US 12,150,253 B2
(45) Date of Patent: Nov. 19, 2024

(54) METHOD OF MOUNTING AND ELECTRICALLY CONTACTING A FIRST PRINTED CIRCUIT BOARD VERTICALLY TO A SECOND PRINTED CIRCUIT BOARD

(71) Applicant: ABB AG, Mannheim (DE)

(72) Inventor: Stefan Gutermuth, Hessen (DE)

(73) Assignee: ABB AG, Mannheim (DE)

( * ) Notice: Subject to any disclaimer, the term of this patent is extended or adjusted under 35 U.S.C. 154(b) by 382 days.

(21) Appl. No.: 17/686,621

(22) Filed: Mar. 4, 2022

(65) Prior Publication Data
US 2022/0287188 A1 Sep. 8, 2022

(30) Foreign Application Priority Data
Mar. 5, 2021 (DE) .......................... 102021105431.1

(51) Int. Cl.
*H05K 3/00* (2006.01)
*G02B 6/36* (2006.01)
*H05K 3/36* (2006.01)
*H05K 7/14* (2006.01)

(52) U.S. Cl.
CPC ........... *H05K 3/366* (2013.01); *G02B 6/3608* (2013.01); *H05K 7/1417* (2013.01)

(58) Field of Classification Search
CPC ..... H05K 3/366; H05K 7/1417; G02B 6/3608
See application file for complete search history.

(56) References Cited

U.S. PATENT DOCUMENTS

| 6,178,094 B1 | 1/2001 | Hakozaki | |
|---|---|---|---|
| 6,381,149 B1 | 4/2002 | Megason et al. | |
| 2006/0232948 A1* | 10/2006 | Haager | H05K 7/1417 361/752 |
| 2013/0183913 A1* | 7/2013 | Tevell | H01Q 1/1207 455/90.3 |
| 2017/0112024 A1* | 4/2017 | Sato | H05K 7/20563 |

FOREIGN PATENT DOCUMENTS

| CN | 102017332 A | 4/2011 |
|---|---|---|
| CN | 102405564 A | 4/2012 |
| CN | 103209549 A | 7/2013 |
| CN | 105792515 A | 7/2016 |
| CN | 209401878 U | 9/2019 |
| CN | 111757616 A | 10/2020 |
| DE | 4244626 C2 | 2/1995 |
| DE | 102020102394 A1 | 9/2020 |

* cited by examiner

*Primary Examiner* — Pete T Lee
(74) *Attorney, Agent, or Firm* — Leydig, Voit & Mayer, Ltd.

(57) ABSTRACT

A system and method of mounting and electrically contacting a first printed circuit board perpendicularly onto a second printed circuit board within a housing includes inserting the first printed circuit board into an upper part of the housing using a stop surface arranged on an inner side surface of the upper part of the housing and arranged to support the electrical contacting and assembly, locking the first printed circuit board in the upper part of the housing using a locking system, and mounting the upper part of the housing with the locked printed circuit board on a lower part of the housing in which the second printed circuit board is mounted.

15 Claims, 6 Drawing Sheets

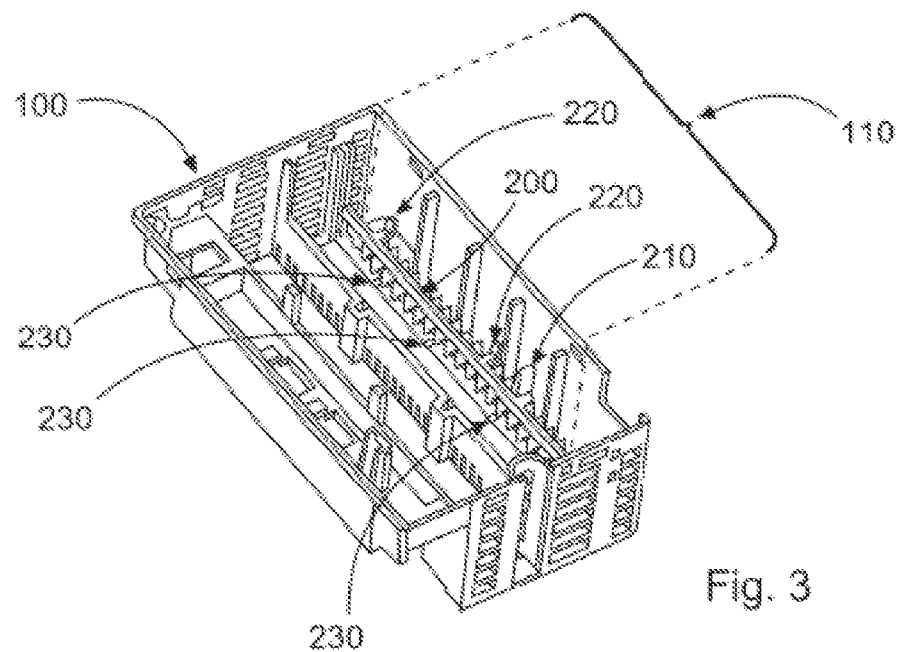
Fig. 3
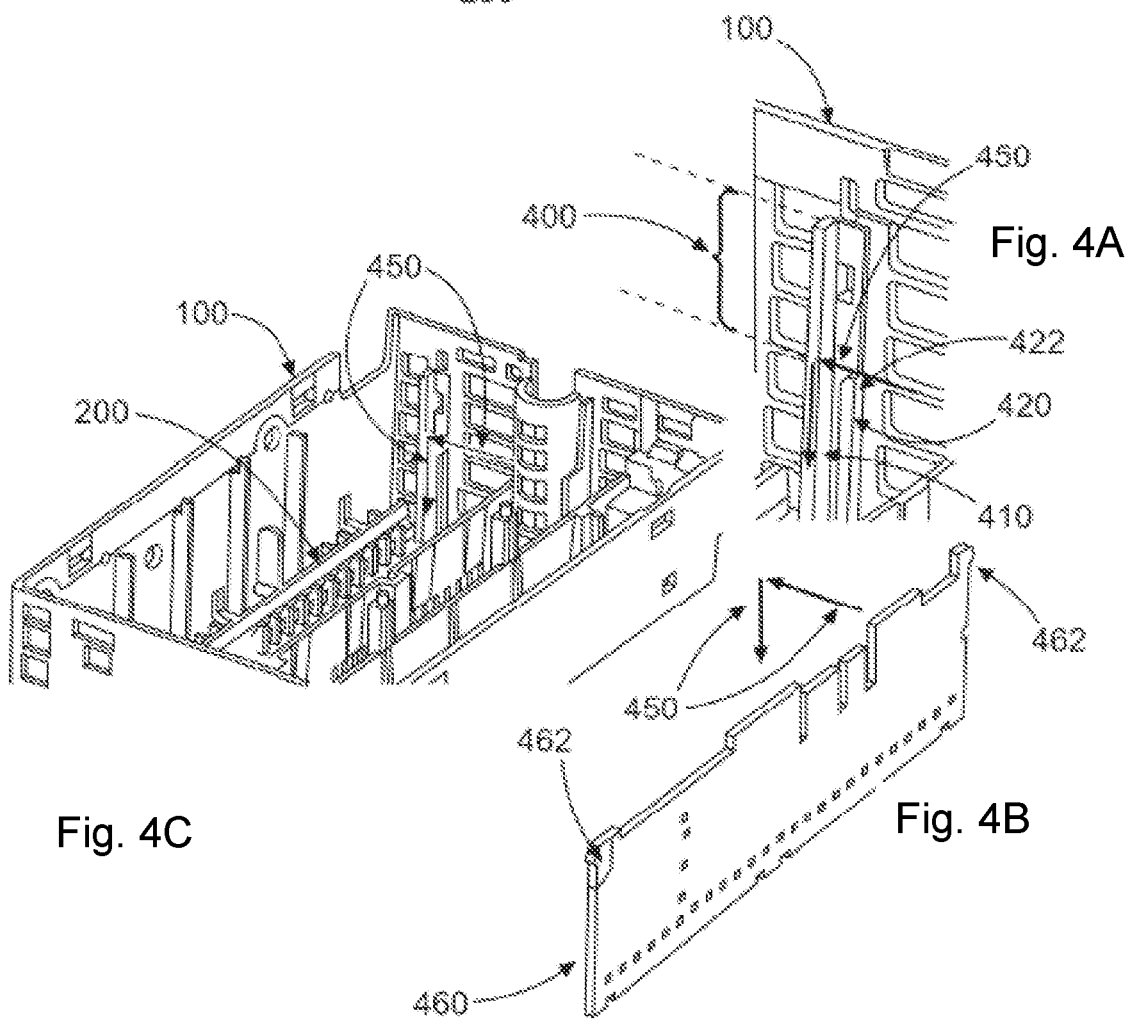
Fig. 4A
Fig. 4B
Fig. 4C

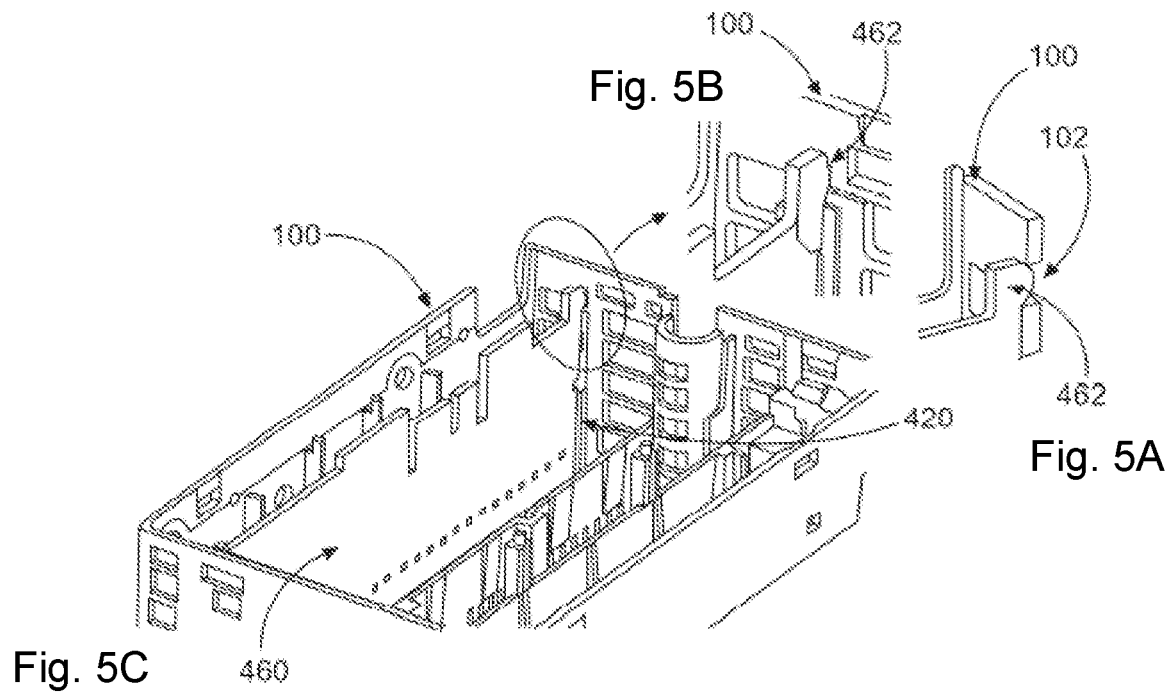
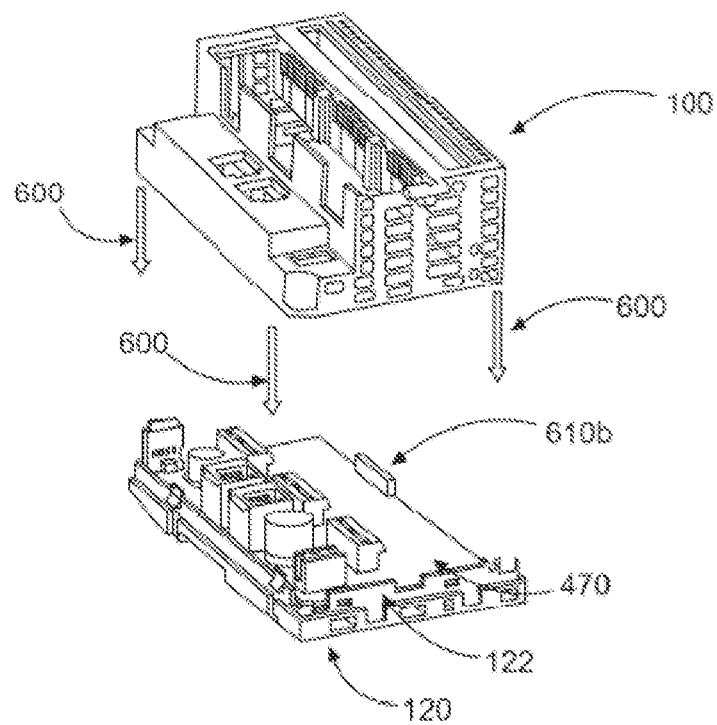

METHOD OF MOUNTING AND ELECTRICALLY CONTACTING A FIRST PRINTED CIRCUIT BOARD VERTICALLY TO A SECOND PRINTED CIRCUIT BOARD

CROSS-REFERENCE TO RELATED APPLICATIONS

This patent application is a convention application claiming priority to German Patent Application No. DE 102021105431.1, filed on 5 Mar. 2021, which is incorporated herein in its entirety by reference.

BACKGROUND OF THE INVENTION

When mounting a vertically oriented printed circuit board to a horizontally oriented printed circuit board with an electrical connector, such as a PCI Express connector, the electrical connection and assembly is typically performed before the resulting unit is mounted in an enclosure. Additionally, if an optical fiber is to be coupled to the vertically oriented circuit board, it is mounted to the vertically oriented circuit board before a housing top, i.e., an upper housing part, covers this circuit board structure.

Since the vertically oriented printed circuit board is never 100% vertically oriented, i.e., at an angle of 90°, without using additional elements for alignment, it is usually hardly possible to mount the vertical printed circuit board on the horizontal printed circuit board so precisely and correctly that the vertical printed circuit board, when the upper part of the housing is mounted, hits exactly into provided slots in the upper part of the housing, which are provided for fixing the vertical printed circuit board in its final place.

BRIEF SUMMARY OF THE INVENTION

The present disclosure is directed to mounting structures and methods for electrical and electronic components. In one embodiment, the assembly and electrical connection of circuit boards becomes difficult if the vertical PCB has to be extended by an additional light guide plastic part on the upper side, which is only properly fixed when it reaches its final position, e.g., through corresponding openings or holes, in the upper part of the housing.

And the chance of hitting the light guide correctly during final assembly with the vertical PCB is almost impossible with a vertical PCB that is not 100% aligned.

According to aspects of the invention, a method for mounting and electrically contacting a first printed circuit board vertically to a second printed circuit board, a housing upper part for receiving a first printed circuit board, and a use of the housing upper part, according to the features of the independent claims, are proposed. Advantageous embodiments are the subject of the dependent claims and the following description.

Accordingly, a method for mounting and electrically contacting a first printed circuit board vertically with respect to a second printed circuit board, for mounting the first printed circuit board and the second printed circuit board in a housing is proposed comprising the following steps.

In one step, the first printed circuit board is inserted into a top portion of the housing utilizing at least one stop surface disposed on at least one inner side surface of the top portion of the housing, the stop surface being adapted to assist in electrically contacting and mounting the first printed circuit board.

In a further step, the first printed circuit board is locked in the upper part of the housing utilizing a locking system. In a further step, the upper part of the housing with the locked printed circuit board is plugged onto a lower part of the housing in which the second printed circuit board is mounted, in order to mount the first printed circuit board vertically to the second printed circuit board in the housing and to contact it electrically by means of respective electrical direct connection elements.

BRIEF DESCRIPTION OF THE SEVERAL VIEWS OF THE DRAWING(S)

With the following figures, the embodiments are further explained.

FIGS. 1A and 1B illustrate a top part of a housing in accordance with the disclosure.

FIGS. 2A, 2B, 2C, and 2D illustrate an assembly of a plurality of light guides in an upper part of a housing in accordance with the disclosure.

FIG. 3 illustrates a plurality of light guides mounted in an upper part of a housing in accordance with the disclosure.

FIGS. 4A, 4B, and 4C illustrate a mounting of a printed circuit board in a top part of a housing with light guides in accordance with the disclosure.

FIGS. 5A, 5B, and 5C illustrate a locking of a printed circuit board in an upper part of a housing in accordance with the disclosure.

FIG. 6 shows an exploded view of a mounting arrangement of an upper part of a housing on a lower part of the housing in accordance with the disclosure.

DETAILED DESCRIPTION OF THE INVENTION

Figure 1A:
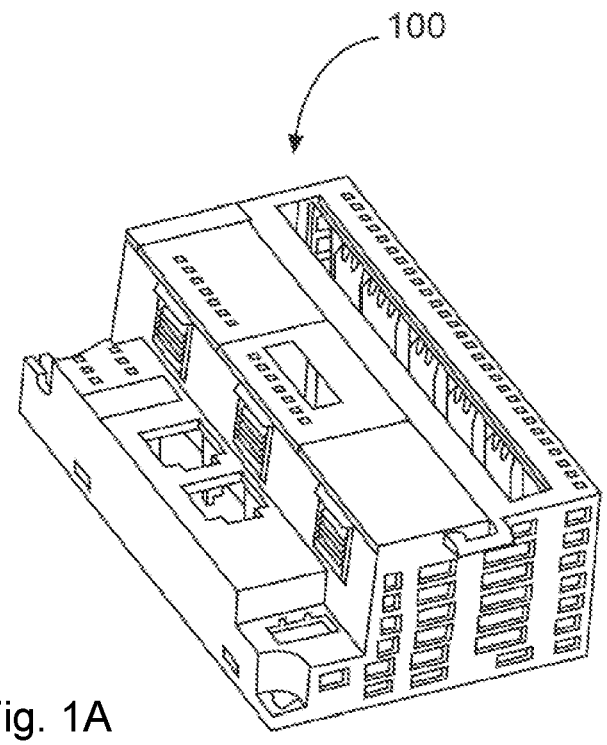

In a disclosed embodiment, a first printed circuit board may be mounted vertically with respect to a horizontally arranged second printed circuit board. In particular, the upper part of the housing may be inserted into the housing by means of two respective stop surfaces arranged on two inner lateral surfaces of the upper part of the housing. These two inner side surfaces may be arranged parallel to each other.

Advantageously, this method results in a simplified mounting concept for mounting the first printed circuit board vertically to the second printed circuit board, wherein the first printed circuit board is mounted and locked in the upper part of the housing and the mounting and electrical contacting with the second printed circuit board arranged vertically thereto takes place when the upper part of the housing is connected to the lower part of the housing, wherein second printed circuit board is arranged in the lower part of the housing.

This considerably reduces the assembly effort and time, for example for a programmable logic controller.

A printed circuit board may be understood to mean a populated printed circuit board (PCBA) on which electrical and electronic components are arranged. The first printed circuit board and the second printed circuit board may each have a corresponding direct connection element to make the electrical connection when the two halves of the housing are assembled.

A first element of the locking system may be fixedly connected to the first printed circuit board and a second element of the locking system may be fixedly connected to the upper part of the housing. The locking system may be arranged such that the two elements of the locking system can elastically engage with each other to lock the first printed circuit board in the upper part of the housing, in particular releasably.

Preferably, at least one side edge of the first printed circuit board is brought into contact with the at least one stop surface to assist insertion into the upper portion of the housing.

In other words, the printed circuit board is first leaned against the stop surface with a side edge until the printed circuit board touches the stop surface and then pushed down into its intended position.

This significantly speeds up and simplifies the assembly of the first PCB in the upper part of the housing.

Further preferably, the insertion of the first printed circuit board into the upper portion of the housing is performed by means of a guide surface of the at least one inner side surface of the upper portion of the housing, the guide surface being adapted to continue the stop surface to insert the first printed circuit board into the upper portion of the housing.

Advantageously, the guide surface allows the PCB to be inserted deeper into the upper part of the housing without losing the position found by the stop during insertion.

Preferably, insertion of the first printed circuit board into the upper portion of the housing occurs in a guide groove disposed on the at least one inner side surface of the upper portion of the housing, the guide groove being formed by the guide surface and a retaining surface to assist in electrical contacting and assembly.

By forming the guide groove, on the one hand, the electrical contacting and assembly can be supported and, in addition, the first printed circuit board can be supported and fixed in operation utilizing the guide groove. Thereby, the support of the electrical contacting and assembly results in particular from the possibility to bring the first printed circuit board up to the stop surface and, with the position thus found, to insert the printed circuit board into the guide groove, whereby the printed circuit board is so precisely aligned and/or placed within the upper part of the housing and is locked by the locking device that the electrical contacting is easily possible due to the precise position.

In particular, the stop surface and/or guide surface and/or the retaining surface may be an integral part of the upper part of the housing, i.e., integrally connected to the upper part of the housing. Furthermore, the stop surface and/or guide surface and/or the retaining surface may each be formed by means of webs arranged in the inner side of the upper part of the housing.

By locking the first printed circuit board in the upper part of the housing, the first printed circuit board in the upper part of the housing together with the guide groove also has only a very limited range of movement to ensure electrical coupling between the two printed circuit boards when the upper part of the housing is mounted on the lower part of the housing.

Preferably, the first printed circuit board comprises a first direct electrical connection element and the second printed circuit board comprises a corresponding second direct electrical connection element, each of which is adapted to establish an electrical coupling between the first printed circuit board and the second printed circuit board arranged vertically thereto when the upper part of the housing is fitted.

The electrical direct connection element may be an electrical PCB direct connection, such as a PCI express connector.

That is, by coupling the first electrical direct connection element to the second electrical direct connection element, a mechanical coupling and an electrical coupling of the two printed circuit boards takes place.

Advantageously, no further work step is necessary for the electrical coupling.

Further preferably, the first circuit board is configured to be coupled to a plurality of light guides on a side opposite to the second circuit board in an assembled state; and the plurality of light guides are mechanically coupled to each other by means of a web; and said plurality of light guides are adapted to be manually inserted into a light guide receptacle of the upper part of the housing by means of a tab mechanically coupled to the web. Further, by means of at least one latching hook mechanically coupled to the web, the plurality of optical fibers is adapted to be locked in a corresponding opening in the top of the housing before the first printed circuit board is inserted into the top of the housing.

Together with the precise positioning of the first printed circuit board in the upper part of the housing, the locking of the plurality of light guides in the upper part of the housing can provide an optical coupling of the first printed circuit board with the plurality of light guides even though the first printed circuit board is mounted in the upper part of the housing in a subsequent step after the plurality of light guides are mounted. By locking the plurality of light guides in the upper part of the housing, the plurality of light guides can be fixed in the upper part of the housing in a functionally reliable manner.

In this regard, the light guide receptacle of the upper part of the housing may be an integral part of the housing, i.e. integrally connected to the upper part of the housing. The light guide receptacle may have apertures in the upper part of the housing to achieve optical coupling of the plurality of light guides with an outer region of the upper part of the housing.

Advantageously, manual assembly of the plurality of light guides by means of the tab is also possible when the upper part of the housing becomes small for manual assembly.

Preferably, the light guide receptacle of the upper portion of the housing having a plurality of light bulkheads is adapted to optically decouple each two light guides of the plurality of light guides from each other; and the respective light bulkheads of the light guide receptacle are adapted to support insertion of the plurality of light guides by means of beveled insertion members.

Advantageously, the light guide receptacle thus fulfils both the task of accommodating the plurality of light guides in the upper part of the housing and of optically decoupling the plurality of light guides from one another in each case. Each of the plurality of light guide bulkheads thus positions individual light guides during assembly.

To this end, the plurality of light bulkheads may be an integral part of the housing, i.e., integrally connected to the top of the housing to avoid the need for a separate component and its additional cost for bulkheading.

Particularly preferably, at least one light guide of the plurality of light guides has an adjustment ridge which is arranged to adjust an adjustment of the plurality of light guides coupled with a ridge with the light guide receptacle by means of a corresponding recess of the light guide receptacle when inserting the plurality of light guides.

Preferably, the upper portion of the housing having centering surfaces is adapted to cooperate with centering surfaces of the lower portion of the housing to effect centering of the upper portion of the housing and the lower portion of the housing during assembly and electrical contacting of a first circuit board vertically with respect to a second circuit board.

The centering surfaces of the top portion of the housing may be disposed on an outer periphery of the top portion of the housing.

An upper housing part of a housing for receiving a first printed circuit board is proposed, comprising:
- at least one stop surface, with which at least one inner side surface of the upper part of the housing is arranged to support an electrical contacting and mounting of the first, in particular assembled, printed circuit board with a vertically arranged second printed circuit board on a bottom part of the housing; and with
- a locking element of a locking system adapted to lock the first printed circuit board in the upper part of the housing to support electrical contacting and mounting of the first printed circuit board vertically to the second printed circuit board in a housing.

Preferably, the upper housing part has a guide surface on the at least one inner side surface of the upper housing part configured to continue the stop surface to assist in mounting and electrically contacting a first circuit board vertically to a second circuit board.

Preferably, the upper housing part has a guide groove on the at least one inner side surface of the upper housing part formed by the guide surface and a retaining surface to assist in mounting and electrically contacting a first circuit board vertically to a second circuit board.

Particularly preferably, the housing upper part has a light guide receptacle which is arranged on an inner surface of the housing upper part and which, with a plurality of light bulkheads and a latching hook receptacle, is arranged to receive a plurality of light guides, which are coupled mechanically to one another by means of a web, for mounting and optical coupling to the first printed circuit board and to lock them by means of the latching hook receptacle.

A use of the above-described upper housing part having a stop surface and an optical fiber receptacle for mounting a programmable logic controller in the housing is proposed.

Figure 1B:
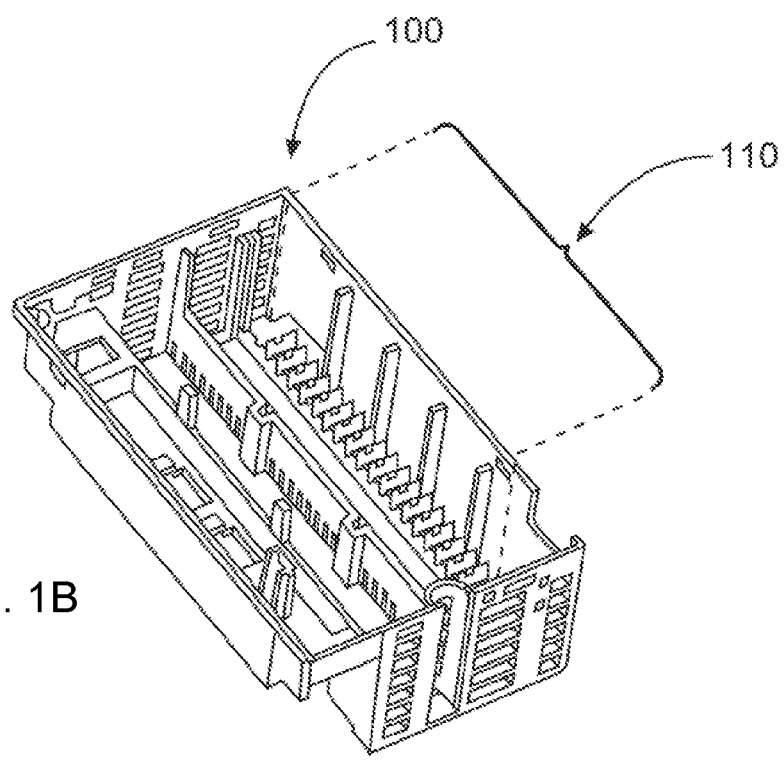

FIG. 1A schematically shows an isometric view of a top portion of a housing 100, and FIG. 1B shows an isometric view of an interior of the top portion of the housing 100 having an optical fiber receptacle 110 for a plurality of optical fibers 200.

Figure 2A:
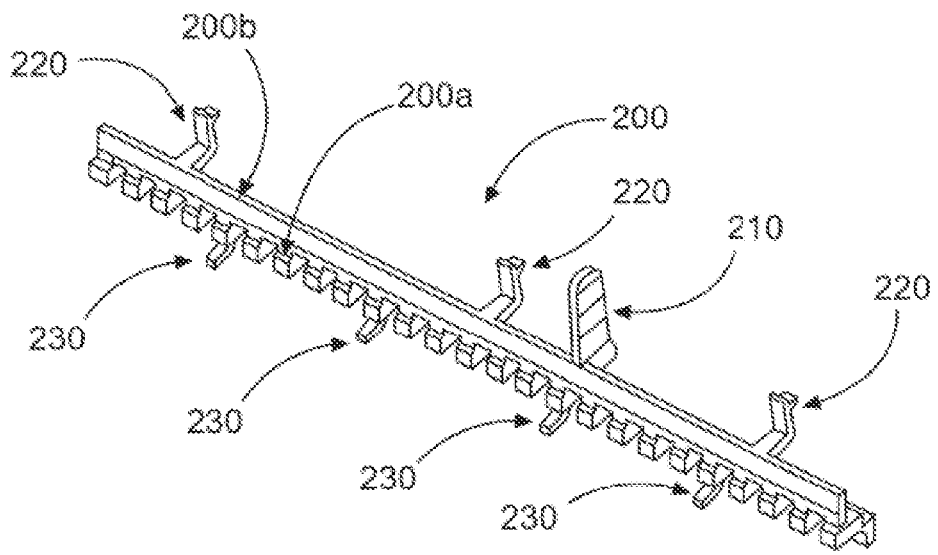

FIG. 2A schematically shows an isometric representation of a plurality of light guides 200, wherein the respective individual light guides 200a are mechanically coupled to each other by a web 200b and the plurality of light guides 200 comprise locking hooks 220 for locking the plurality of light guides in the upper part of the housing 100 in the light guide receptacle 110 by means of a corresponding opening in the upper part of the housing. Further, the plurality of respective light guides 200a coupled to the web 200b comprises an adjustment web configured to adjust an adjustment of the plurality of light guides 200a coupled to the web 220b by means of a corresponding recess in the light guide receptacle 110 when the plurality of light guides 200 are inserted. Further, the plurality of light guides 200a coupled to the web 200b is provided with a tab 210 by means of which the plurality of light guides 200 are adapted to be manually inserted into the light guide receptacle 110 of the upper portion of the housing 100.

Figure 2B:
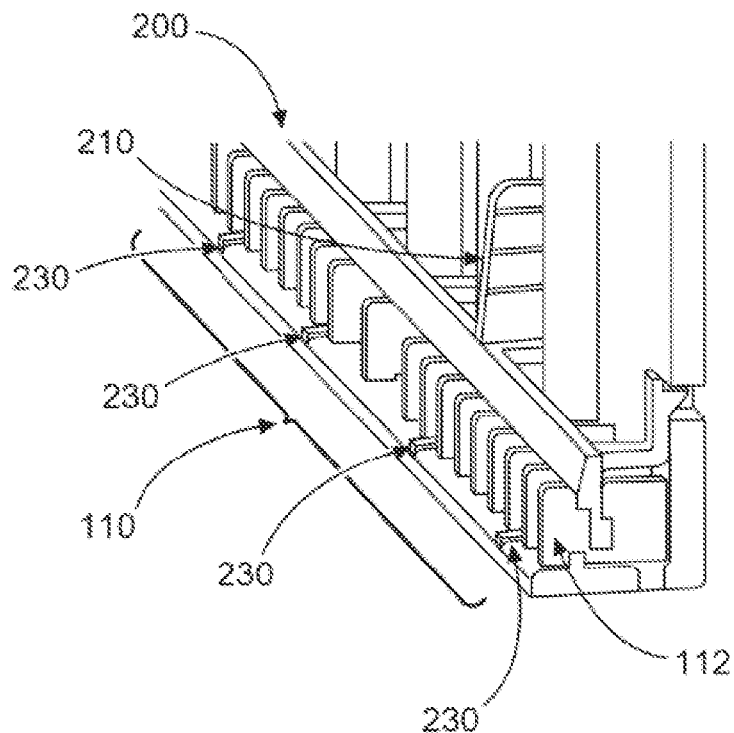

FIG. 2B schematically illustrates an isometric view of the light guide receptacle 110 of the upper portion of the housing 100 in which the plurality of light guides 200 are inserted, wherein the individual light guides 200a coupled to the web 200b are each optically decoupled from each other by light bulkheads 112, and the light bulkheads 112 are configured by means of beveled insertion elements 114 to support the insertion of the plurality of light guides 200. Further, it is shown how a latching hook 220 of the plurality of coupled light guides 200 is locked into a corresponding opening in the upper portion of the housing. Furthermore, it is shown how adjustment tabs 230 engage corresponding recesses in the light guide receptacle 110 to assist in adjusting the plurality of web-coupled light guides 200 with the light guide receptacle 110 during insertion.

Figure 2C:
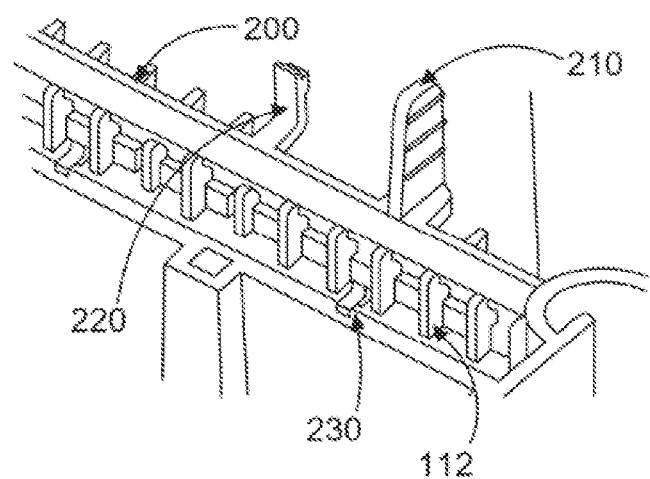

FIG. 2C illustrates the structures shown in FIG. 2B from a different perspective.

Figure 2D:
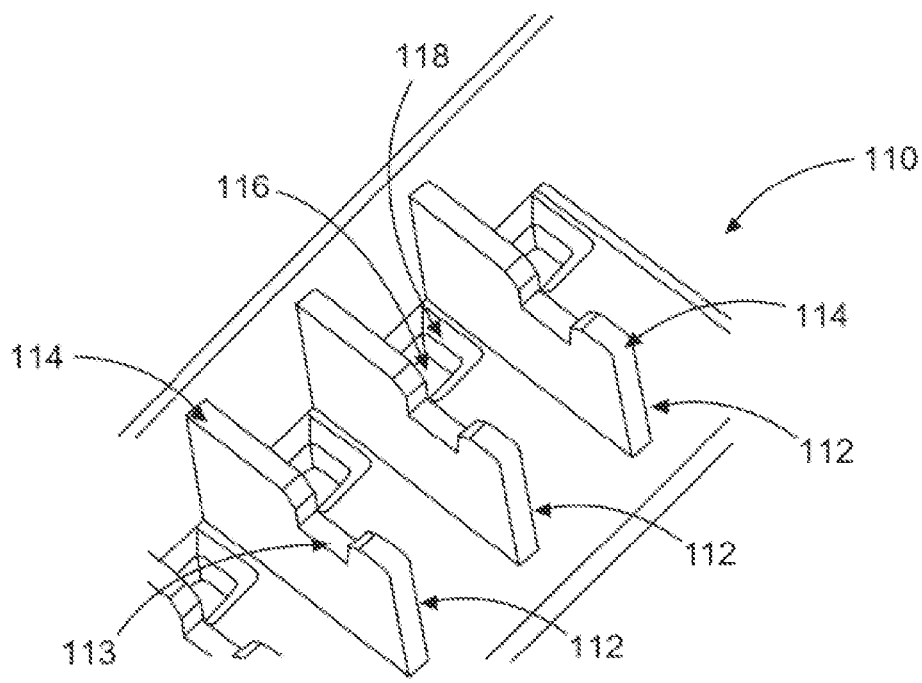

FIG. 2D is an enlarged, closeup detail view of three light bulkheads 112 of the light guide receptacle 110 of the upper part of the housing 100 having recesses 113 to fix the web 200b of the coupled plurality of respective light guides 200a in a position, wherein the recesses 113 of the respective light bulkheads 112 are adapted to at least partially encompass the web 200b, respectively. In this regard, the respective light bulkhead 112 is configured with a beveled insertion element 114 to support a mounting of the plurality of light guides 200 at the designated position of the light guide receptacle 110. Furthermore, the light guide receptacle 110 for the respective light guide 200a has aperture openings in the housing 116 to receive portions of the respective light guide 200a and optically couple them to an outer surface of the upper portion of the housing 100. In this regard, the aperture opening 116 in the upper portion of the housing 100 is configured with a taper 118 to achieve self-alignment of the respective light guide 200a when the plurality of light guides 200 are mounted to the respective aperture opening 116.

Manual mounting of the plurality of light guides 200 in the light guide receptacle 110 of the upper portion of the housing 100 can be facilitated by means of the tab 210, which is mechanically coupled to the plurality of light guides 200, to manually place the plurality of light guides 200 in the light guide receptacle 100. This is particularly true when a space for mounting the plurality of light guides 200 is limited, for example due to a small housing. In the manner described, the plurality of light guides 200 can be placed in the light guide receptacle 110 and "clicked" into the upper portion of the housing 100 by means of the latching hooks 220. Once the plurality of light guides 200 is fixed in the upper portion of the housing 100, the housing could also be inverted without the plurality of light guides 200 falling out of the upper portion of the housing 100.

FIG. 3 schematically shows an isometric view of the interior of the upper part of the housing 100 with a light guide receptacle 110 for the plurality of light guides 200 with the described latching hooks 220, which are locked in corresponding openings in the upper part of the housing 100 and the plurality of light guides 210 are adjusted with adjustment bars 230 in corresponding recesses of the light guide receptacle 110.

Referring to FIGS. 4A, 4B and 4C, a schematic description of a procedure for mounting the first printed circuit board 460 into the upper portion of the housing 100 is provided.

As a starting point, FIG. 4C shows the upper part of the housing 110 into which, in a previous step, for example manually, the plurality of optical fibers 200 have been inserted into the optical fiber receptacle 110 of the upper part of the housing 100 and have been locked with locking hooks 220 into corresponding openings in the upper part of the housing 100. The upper part of the housing 100 has a stop surface 400 on two opposite inner sides, which is arranged to support the electrical contacting and mounting of the first printed circuit board 460, and in particular the insertion of the first printed circuit board 460 into the upper part of the housing 100.

Further, the top portion of the housing 100 includes a guide surface 410 on two opposing inner side surfaces of the top portion of the housing 100, the respective guide surface 410 being arranged and configured to continue the respective abutment surface 400 to assist in inserting the first circuit board 460 into the top portion of the housing 100.

In addition, the upper part of the housing 100 comprises a guide groove arranged on two opposite sides of the inner side surface of the upper part of the housing 100, the guide groove being formed by the guide surface 410 and a holding surface 420 in order to support the electrical contacting and assembly, and in particular the insertion, of the first printed circuit board 460 into the upper part of the housing 100. In this regard, the stop surface 400 and/or guide surface 410 and/or the retaining surface 420 may be an integral part of the upper part of the housing 100, that is, integrally connected to the upper part of the housing 100.

In particular, the stop surface 400 and/or guide surface 410 and/or the retaining surface 420 may be formed by ridges formed on the inner surface of the upper portion of the housing 100. By means of the stop surface 400 and/or the guide surface 410 and/or the retaining surface 420, a simple and quick insertion of the first printed circuit board 460 is possible. In other words, the stop surface 400 forms an insertion aid into the guide groove formed by the guide surface 410 and retaining surface 420.

For assembly, the first printed circuit board 460 is inserted into the upper portion of the housing 100 by having a side edge of the first printed circuit board 460 cooperate with the stop surface 400 such that the first printed circuit board 460 can be properly placed 450 into the upper portion of the housing 100. The guide surface 410 enables a guided insertion of the first printed circuit board 460 into the upper part of the housing 100, the insertion being further assisted by the stop surface 420 to correctly place the first printed circuit board 460 in the upper part of the housing 100, in particular for a subsequent electrical contacting. This insertion with the interaction of the first printed circuit board 460 with the stop surface 400 and the subsequent insertion into the upper part of the housing 100 is illustrated with the arrows 450 in FIG. 4A, which correspond to arrows in FIG. 4C and also to arrows in FIG. 4B.

FIG. 4B schematically shows an isometric representation of the first printed circuit board 460, which has on each of two sides, in particular by means of the outer contour of the first printed circuit board 460, an element of a locking system with which the first printed circuit board 460 can be locked in a corresponding recess 102 of the upper part of the housing 100, the corresponding recess forming a corresponding element of the locking system. In this regard, the locking system may be configured to form a latched high resistance to displacement of the first circuit board 460 in the upper portion of the housing 100. In this regard, the latching system may be configured to release the latching with overcoming a minimal force applied to the first circuit board 460. The latching system is configured to fully secure the first circuit board 460 and prevent it from falling out of the top portion of the housing 100 when the top portion of the housing 100 is rotated "upside down."

FIG. 5C schematically illustrates an isometric view of the first circuit board 460 inserted into the upper portion of the housing 100 and locked in position. Here, the first circuit board 460 is arranged and placed in the groove formed by the guide surface 410 and the retaining surface 420.

FIGS. 5A and 5B schematically show sections of the isometric representation of FIG. 5C from different perspectives to describe the interaction of the first element perspec of the locking system 462, which is mechanically connected to the printed circuit board 460, and the second element of the locking system, the corresponding recess 102 of the upper part of the housing 100. In this regard, the first element 462 and the second element of the locking system 102 are arranged such that the first element 462 can elastically engage the second element 102 of the locking system in order to lock the first circuit board 460 in the upper part of the housing 100.

FIG. 6 schematically sketches a mounting of the upper portion of the housing 100 onto a lower portion 120 of the housing, wherein a second circuit board 470 is mounted in the lower portion 120 of the housing.

The upper part of the housing 100 with the locked printed circuit board 460 is plugged onto the lower part 120 of the housing in which the second printed circuit board 470 is mounted, rotated 180 degrees "upside down" with respect to the previous mounting (direction of arrow 600), in order to mount the first printed circuit board 460 vertically with respect to the second printed circuit board 470 in the housing and to make electrical contact with it by means of respective electrical direct connection elements 610a, 610b. In this regard, the lower portion 120 may include insertion aids 122 on the outer edge of the lower portion to facilitate precise positioning of the upper portion of the housing 100 on the lower portion 120 of the housing.

Together with the pre-centering function of the upper and lower housing parts by means of the import aids 122, the respective electrical direct connection elements 610a, 610b of the vertically arranged first printed circuit board 460 and the horizontally arranged second printed circuit board 470 meet. With some pressure on the upper part of the housing 100, the housing can be closed by means of corresponding latching elements of the housing parts.

Figure 7A:
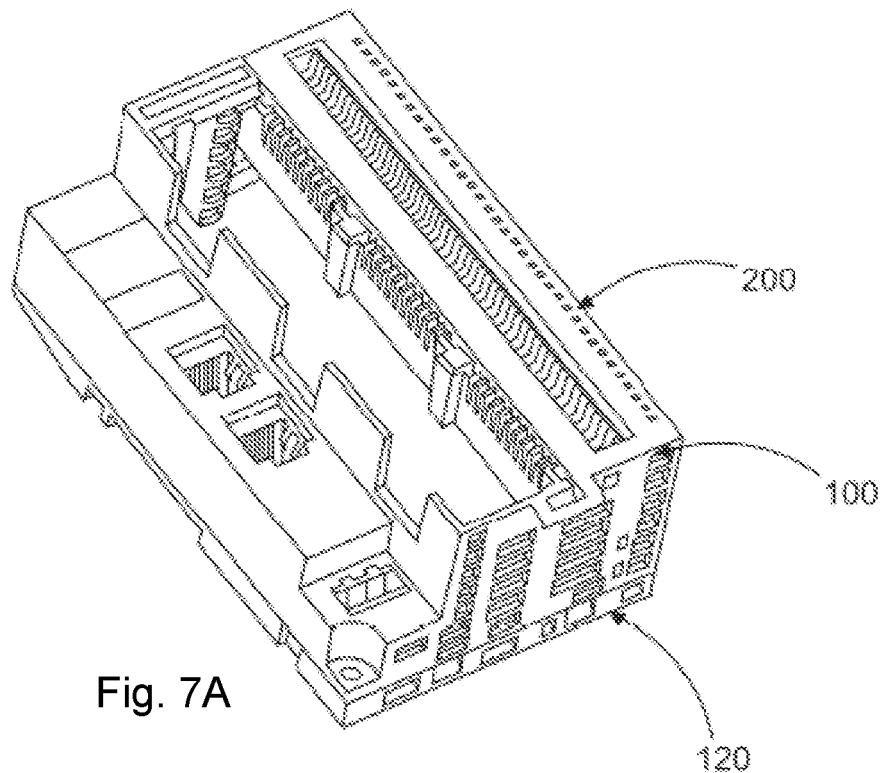
FIG. 7A illustrates a view of a housing with mounted printed circuit boards in accordance with the disclosure.
Figure 7B:
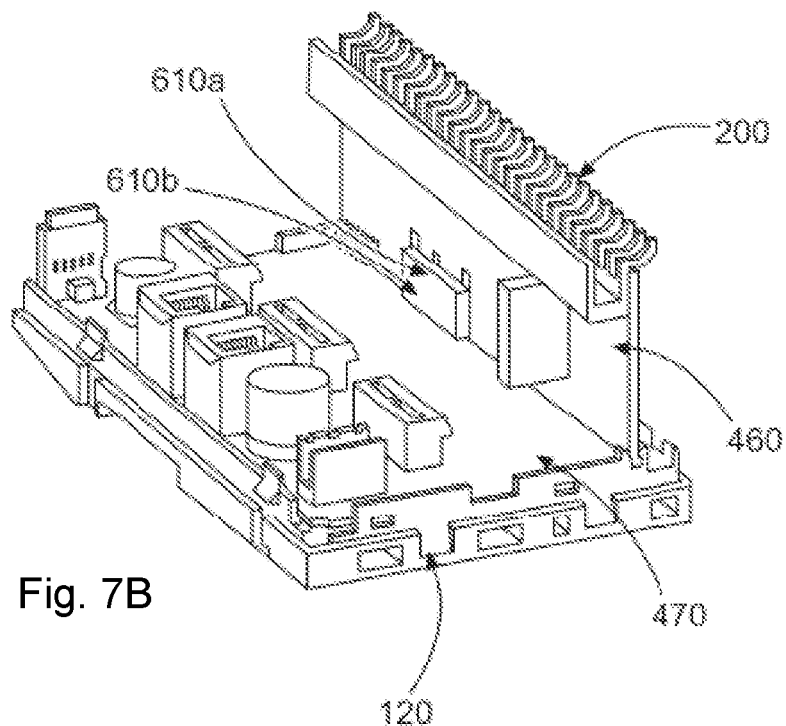
FIG. 7B illustrates a mounted vertically oriented printed circuit board on a lower part of a housing with a vertical printed circuit board without the upper part of the housing in accordance with the disclosure.

FIG. 7A schematically shows an isometric representation of a housing formed by the upper part 101 and the lower part 120 of the housing, in which a first printed circuit board 460 is arranged vertically on a second printed circuit board 470 mounted in the lower part of the housing 120 and is electrically connected, by means of respective electrical direct connection elements. The arrangement first circuit board 460 vertical to the second circuit board 470 inside the housing is shown in FIG. 7B.

In the present disclosure, the terms "optical fiber" may be used interchangeably with the term "light guide."

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B")

is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of mounting and electrically contacting a first printed circuit board perpendicularly to a second printed circuit board, for mounting the first printed circuit board and the second printed circuit board in a housing, the method comprising:

inserting the first printed circuit board into an upper part of the housing by utilizing at least one stop surface arranged on at least one inner side surface of the upper part of the housing, the at least one stop surface being configured to support electrical contacting and assembly;

locking the first printed circuit board in the upper part of the housing utilizing a locking system;

mounting the upper part of the housing with the locked first printed circuit board on a lower part of the housing in which the second printed circuit board is mounted, wherein mounting the upper part of the housing on the lower part of the housing also operates to mount the first printed circuit board perpendicularly relative and onto the second printed circuit board in the housing and to contact the first printed circuit board electrically through respective electrical direct connection elements.

2. The method of claim 1, wherein at least one side edge of the first printed circuit board is brought into contact with the at least one stop surface for assisting insertion into the upper part of the housing.

3. The method of claim 1, wherein the insertion of the first printed circuit board into the upper part of the housing is performed by utilizing a guide surface formed on the at least one inner side surface of the upper part of the housing, wherein the guide surface is arranged to continue the stop surface in order to insert at least a portion of the first printed circuit board into the upper part of the housing.

4. The method of claim 3, wherein insertion of the first printed circuit board into the top of the housing is accomplished by utilizing a guide groove disposed on the at least one inner side surface of the top of the housing, the guide groove being formed by the guide surface and a retaining surface to assist electrical contacting and assembly.

5. The method of claim 1, wherein the first printed circuit board comprises a first direct electrical connection element and the second printed circuit board comprises a corresponding second direct electrical connection element, each of which is arranged to establish an electrical coupling between the first printed circuit board and the second printed circuit board when the upper part of the housing is mounted onto the lower part of the housing.

6. The method of claim 1, wherein said first printed circuit board is adapted to be coupled to a plurality of optical fibers on a side opposite to said second printed circuit board when mounted; and said plurality of optical fibers are mechanically coupled to each other through a ridge.

7. The method of claim 6, wherein said plurality of optical fibers is adapted to be manually inserted into an optical fiber receptacle disposed on the top of the housing and secured thereto with a tab, the tab being mechanically coupled to a web.

8. The method of claim 7, wherein said plurality of optical fibers is adapted to be manually inserted into the optical fiber receptacle on the top of the housing by at least one latching hook, and wherein the latching hook is adapted to be locked in a corresponding opening in the upper part of the housing before the first printed circuit board is inserted into the upper part of the housing.

9. The method of claim 8, wherein the optical fiber receptacle of the upper part of the housing is arranged with a plurality of light bulkheads to optically decouple each two light guides of the plurality of light guides from each other; and the respective light bulkheads of the optical fiber receptacle are arranged to support the insertion of the plurality of optical fibers using beveled insertion elements.

10. The method of claim 9, wherein at least one optical fiber of the plurality of optical fibers comprises an adjustment ridge configured to assist an adjustment of the plurality of optical fibers coupled with a ridge with the optical fiber receptacle using a corresponding recess of the optical fiber receptacle when inserting the plurality of optical fibers.

11. The method of claim 1, wherein the upper portion of the housing further includes centering surfaces adapted to cooperate with corresponding centering surfaces of the lower portion of the housing to effect centering of the upper portion of the housing and the lower portion of the housing during assembly and electrical contacting of a first circuit board perpendicularly with respect to a second circuit board.

12. An upper housing part of a housing for accommodating a first printed circuit board, comprising:

at least one stop surface with which at least an inner side surface of the top portion of the housing is adapted to support electrical contacting and mounting of the first printed circuit board with a perpendicularly disposed second printed circuit board on a bottom portion of the housing; and a locking member of a locking system configured to lock the first printed circuit board in the top portion of the housing, to support electrical contacting and mounting of the first printed circuit board perpendicularly relative to the second printed circuit board in the housing.

13. The upper housing part according to claim 12, further comprising a guide surface formed on the at least one inner side surface of the top portion of the housing, the guide surface configured to extend the stop surface and operating to assist in mounting and electrically contacting a first circuit board perpendicularly relative to a second circuit board.

14. The upper housing part according to claim 13, further comprising a guide groove formed on the at least one inner side surface of the top portion of the housing, the guide groove formed between the guide surface and a retaining surface, the guide groove configured to assist in mounting and electrically contacting the first printed circuit board perpendicularly relative to the second printed circuit board.

15. The upper housing part according to claim 14, further comprising a light guide receptacle disposed on an inner surface of the top of the housing, the light guide receptacle being configured with a plurality of light bulkheads and a latching hook receptacle to receive a plurality of light guides mechanically coupled to each other by a web for mounting and optically coupling to the first circuit board and to be locked by the latching hook receptacle.

* * * * *